US011107527B1

(12) United States Patent
Yin et al.

(10) Patent No.: US 11,107,527 B1
(45) Date of Patent: Aug. 31, 2021

(54) REDUCING SNEAK CURRENT PATH IN CROSSBAR ARRAY CIRCUITS

(71) Applicant: TETRAMEM INC., Newark, CA (US)

(72) Inventors: Wenbo Yin, Newark, CA (US); Ning Ge, Newark, CA (US)

(73) Assignee: TetraMem Inc., Newark, CA (US)

( * ) Notice: Subject to any disclaimer, the term of this patent is extended or adjusted under 35 U.S.C. 154(b) by 0 days.

(21) Appl. No.: 16/802,443

(22) Filed: Feb. 26, 2020

(51) Int. Cl.
*G11C 13/00* (2006.01)
*H01L 27/24* (2006.01)

(52) U.S. Cl.
CPC ........ *G11C 13/004* (2013.01); *G11C 13/0023* (2013.01); *H01L 27/2436* (2013.01)

(58) Field of Classification Search
CPC .............. G11C 13/004; G11C 13/0023; H01L 27/2436
See application file for complete search history.

(56) References Cited

U.S. PATENT DOCUMENTS

| 8,045,361 B2 * | 10/2011 | Lee | G11C 11/16 365/148 |
| 8,593,854 B1 * | 11/2013 | Chih | G11C 13/0023 365/148 |
| 9,424,914 B2 * | 8/2016 | Shieh | G11C 13/0069 |
| 9,431,603 B1 * | 8/2016 | Hsieh | H01L 45/1691 |
| 9,543,511 B2 * | 1/2017 | Sung | H01L 27/2436 |
| 9,812,641 B2 * | 11/2017 | Liao | H01L 45/1233 |
| 10,163,503 B2 * | 12/2018 | Lee | G11C 13/0023 |
| 10,163,505 B2 * | 12/2018 | Lee | G11C 13/0069 |

* cited by examiner

*Primary Examiner* — Tri M Hoang
(74) *Attorney, Agent, or Firm* — MagStone Law LLP

(57) ABSTRACT

Technologies relating to crossbar array circuits with nTnR design to reduce sneak current path and minimize area size are disclosed. An example crossbar array circuit includes: a first transistor comprising a first source terminal, a first drain terminal and a first gate terminal; a first RRAM device connected to the first source terminal of the first transistor; a second transistor comprising a second source terminal, a second drain terminal and a second gate terminal; a second RRAM device connected to the second source terminal of the second transistor; a word line connected to the first drain terminal of the first transistor and the second drain terminal of the second transistor; a first bit line connected to the first RRAM device; and a second bit line connected to the second RRAM device, wherein the first gate terminal of the first transistor is configured to be connected to a first selective voltage source, and the second gate terminal is configured to be connected to a second selective voltage source.

8 Claims, 5 Drawing Sheets

US 11,107,527 B1

REDUCING SNEAK CURRENT PATH IN CROSSBAR ARRAY CIRCUITS

TECHNICAL FIELD

The present disclosure relates generally to crossbar array circuits equipped with one or more Resistive Random-Access Memory units (also referred to as RRAMs) and more specifically to crossbar array circuits having an nTnR design to reduce sneak current path and minimize area size.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, computing-in memory and so on.

An RRAM is a two-terminal passive device capable of changing resistance responsive to sufficient electrical stimulations, which have attracted significant attention for its applications in high-performance non-volatile memories. The resistance of an RRAM may be electrically switched between two states: a High-Resistance State (HRS) and a Low-Resistance State (LRS). The switching event from an HRS to an LRS is often referred to as a "Set" or "On" switch; the switching systems from an LRS to an HRS is often referred to as a "Reset" or "Off" switching process.

The occurrence of sneak currents within resistive memories, however, remains a technical challenge, however. Particularly, sneak currents have significant negative impact on large-scale crossbar array circuits. For example, sneak currents may result in unwanted actions (e.g., unintended programming of an electronic device) or may prevent desired performance (e.g., accurate signal reads). These technical problems caused by sneak currents are exacerbated in in-memory computing applications and neuromorphic computing applications. For instance, during neuromorphic computing operations, when adapting synaptic weights in accordance with the discrete conductance states of a RRAM, a slight change in the RRAM's conductance RRAM may cause inaccurate output.

SUMMARY

Technologies relating to reducing sneak current path and area size in crossbar array circuits using a nTnR design are disclosed.

A crossbar array circuit, in some implementations, includes: a first transistor comprising a first source terminal, a first drain terminal and a first gate terminal; a first RRAM device connected to the first source terminal of the first transistor; a second transistor comprising a second source terminal, a second drain terminal and a second gate terminal; a second RRAM device connected to the second source terminal of the second transistor; a word line connected to the first drain terminal of the first transistor and the second drain terminal of the second transistor; a first bit line connected to the first RRAM device; and a second bit line connected to the second RRAM device, wherein the first gate terminal of the first transistor is configured to be connected to a first selective voltage source, and the second gate terminal is configured to be connected to a second selective voltage source.

In some implementations, the first transistor, and the second transistor are formed on a same substrate.

In some implementations, a material of the substrate includes Si, $SiO_2$, indium gallium zinc oxide (IGZO), indium tin oxide (ITO), or glass.

In some implementations, the first source terminal and the second source terminal are a same source region on the substrate.

In some implementations, the first drain terminal is a first drain region on the substrate, the second drain terminal is a second drain region on the substrate; and the source region, the first drain region, or the second drain region is n-doped or p-doped.

In some implementations, the first RRAM device includes a first bottom electrode, a first RRAM oxide formed on the first bottom electrode, and a first top electrode formed on the first RRAM oxide; and the second RRAM device includes a second bottom electrode, a second RRAM oxide formed on the second bottom electrode, and a second top electrode formed on the second RRAM oxide.

In some implementations, a material of the first top electrode, the first bottom electrode, a second top electrode, or the second bottom electrode includes Pd, Pt, Ir, W, Ta, Hf, Nb, V, Ti, TiN, TaN, NbN, or the combination of alloy or other conductive materials thereof.

In some implementations, a material of the first RRAM oxide, or the second RRAM oxide comprises $TaO_x$ (where $x \leq 2.5$), $HfO_x$ (where $x \leq 2$), $TiO_x$ (where $x \leq 2$), or the combination thereof.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to reducing sneak current path and area size in crossbar array circuits using a nTnR design are disclosed. The technologies described in the present disclosure may provide the following technical advantages.

First, an nTnR design is implemented to reduce sneak current paths that may exist during computing operations and to increase the readability and writability of a crossbar array circuit, which in turn provides a greater operating range and improves yield.

Second, using an nTnR design, especially with a shared area of transistors in a crossbar array circuit, the area size per bit is reduce, providing a higher density. This nTnR design is thus particularly advantageous for implementation in large-scale crossbar array circuits, such as crossbar array circuits for in-memory computing or neuromorphic computing.

Third, devices included in an nTnR design may be stacked in 3 dimensions, providing a higher density than conventional 1T1R designs do. Arranging devices in all 3 dimensions provides a greater number of circuit designs, increasing the scalability and flexibility of crossbar array circuits.

Fourth, an nTnR design is simple to implement and effectively eliminates unwanted sneak current path and access latency—without requiring peripheral circuit components or software algorithms. Removing the requirement for peripheral circuit components or software algorithms reduces the likelihood of error or defects that often increases as circuit design complicates.

Figures 1A, 1B:
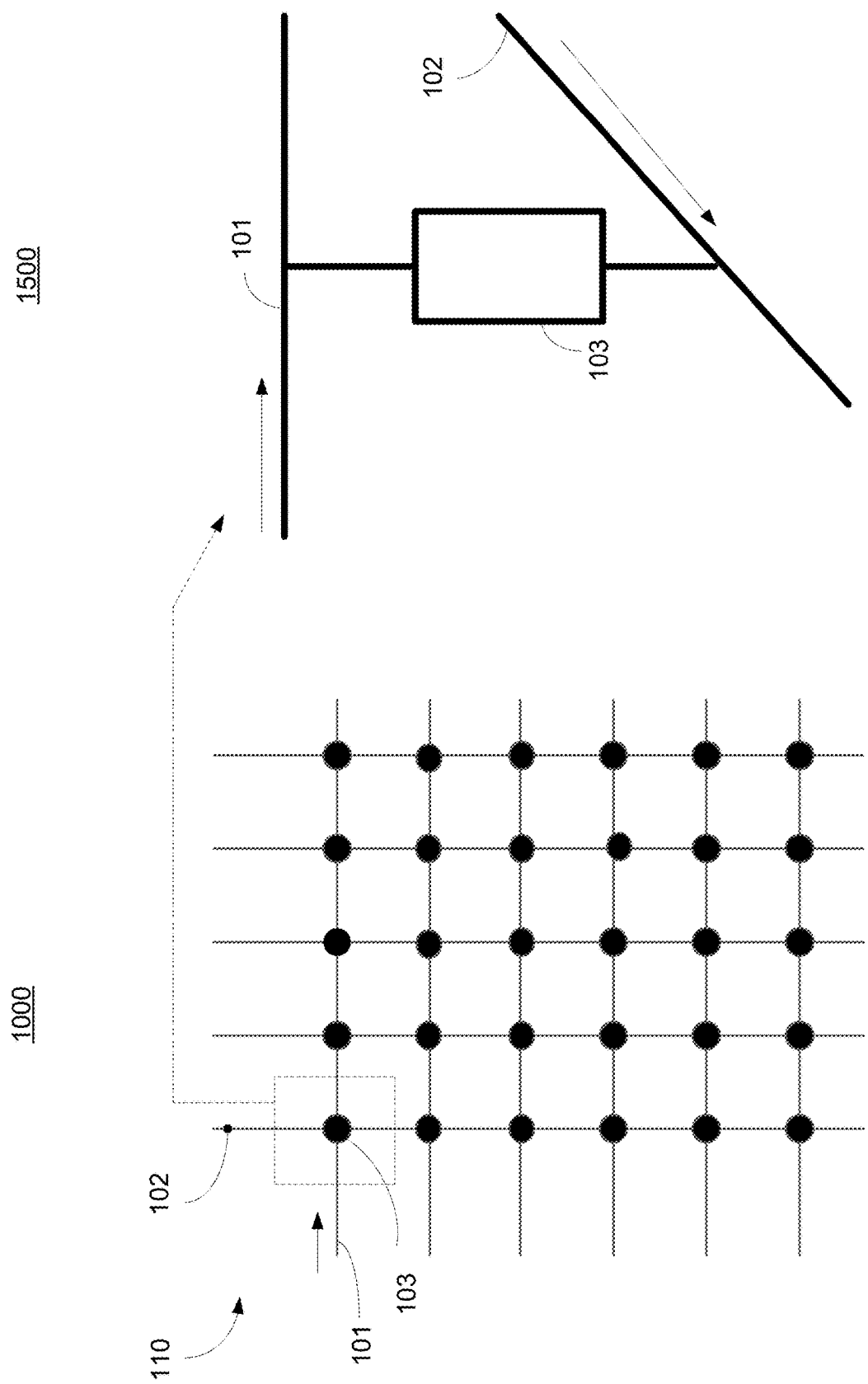
FIG. 1A is a block diagram illustrating an example crossbar array circuit in accordance with some implementations of the present disclosure.
FIG. 1B is a block diagram illustrating a partially enlarged view of the crossbar array circuit shown in FIG. 1A in accordance with some implementations of the present disclosure.

FIG. 1A is a block diagram 1000 illustrating an example crossbar array circuit 110. FIG. 1B is a block diagram 1500 illustrating a partially enlarged view of the crossbar array circuit 110.

FIG. 1A is a block diagram 1000 illustrating an example crossbar array circuit 110. FIG. 1B is a block diagram 1500 illustrating a partially enlarged view of the crossbar array circuit 110.

As shown in FIGS. 1A-1B, the crossbar array circuit 110 includes one or more of bit lines (e.g., a first bit line 101), one or more word lines (e.g., a first word line 102), and one or more RRAM cells (e.g., a first RRAM cell 103) located between and connected to the bit lines and the word lines.

Figure 2:
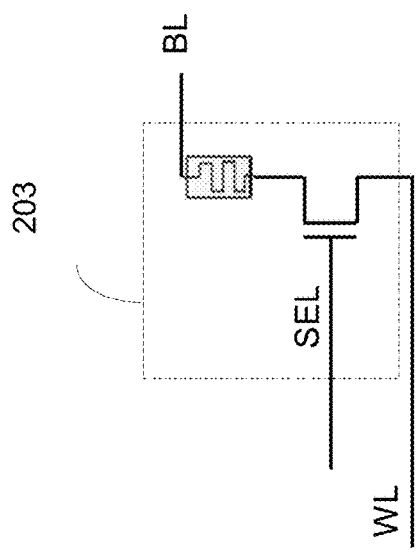
FIG. 2 is a block diagram illustrating an example 1T1R cell.

FIG. 2 is a block diagram 2000 illustrating an example one-Transistor-one-memRistor (1T1R) RRAM cell 203.

As shown in FIG. 2, the 1T1R RRAM cell 203 includes a transistor, a RRAM device serially connected to a first terminal of the transistor (e.g., a source terminal), a word line connected to a second terminal of the transistor (e.g., a drain terminal), and a bit line connected to the RRAM device.

As can be seen, a 1T1R RRAM cell has a simple CMOS-RRAM integration. To compete with stand-alone memory or storage class memory, a RRAM device is required to provide higher density than a 1T1R structure provides.

Figure 3:
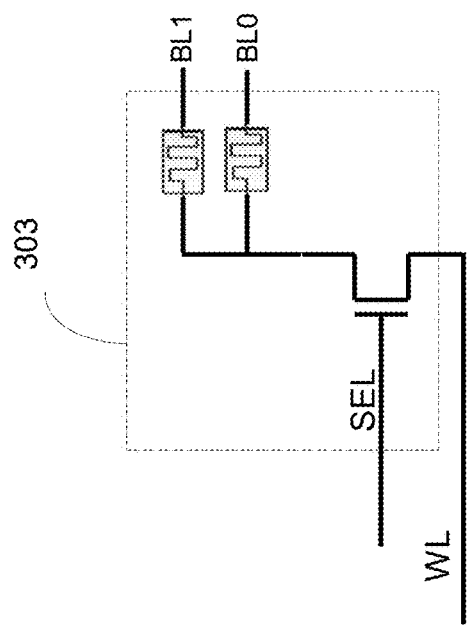
FIG. 3 is a block diagram illustrating an example 1T2R cell.

FIG. 3 is a block diagram illustrating an example one-Transistor-two-memRistor (1T2R) RRAM cell 303.

As shown in FIG. 3, the 1T2R RRAM cell 303 includes a transistor, a first RRAM device serially connected to a first terminal of the transistor (e.g., a source terminal), a second RRAM device serially connected to the first terminal of the transistor and parallelly connected to the first RRAM device, a word line connected to a second terminal (e.g., a drain terminal) of the transistor, a first bit line connected to the first RRAM device, and a second bit line connected to the second RRAM device.

A 1T2R RRAM cell provides a higher density: only a single transistor is needed to control two RRAM devices. High density is a crucial performance metric for storage-class memory or other applications. Despite these technical advantages, challenges remain for implementing one or more 1T2R RRAM cells in a crossbar circuit, due to the existence of sneak current paths.

Figure 4:
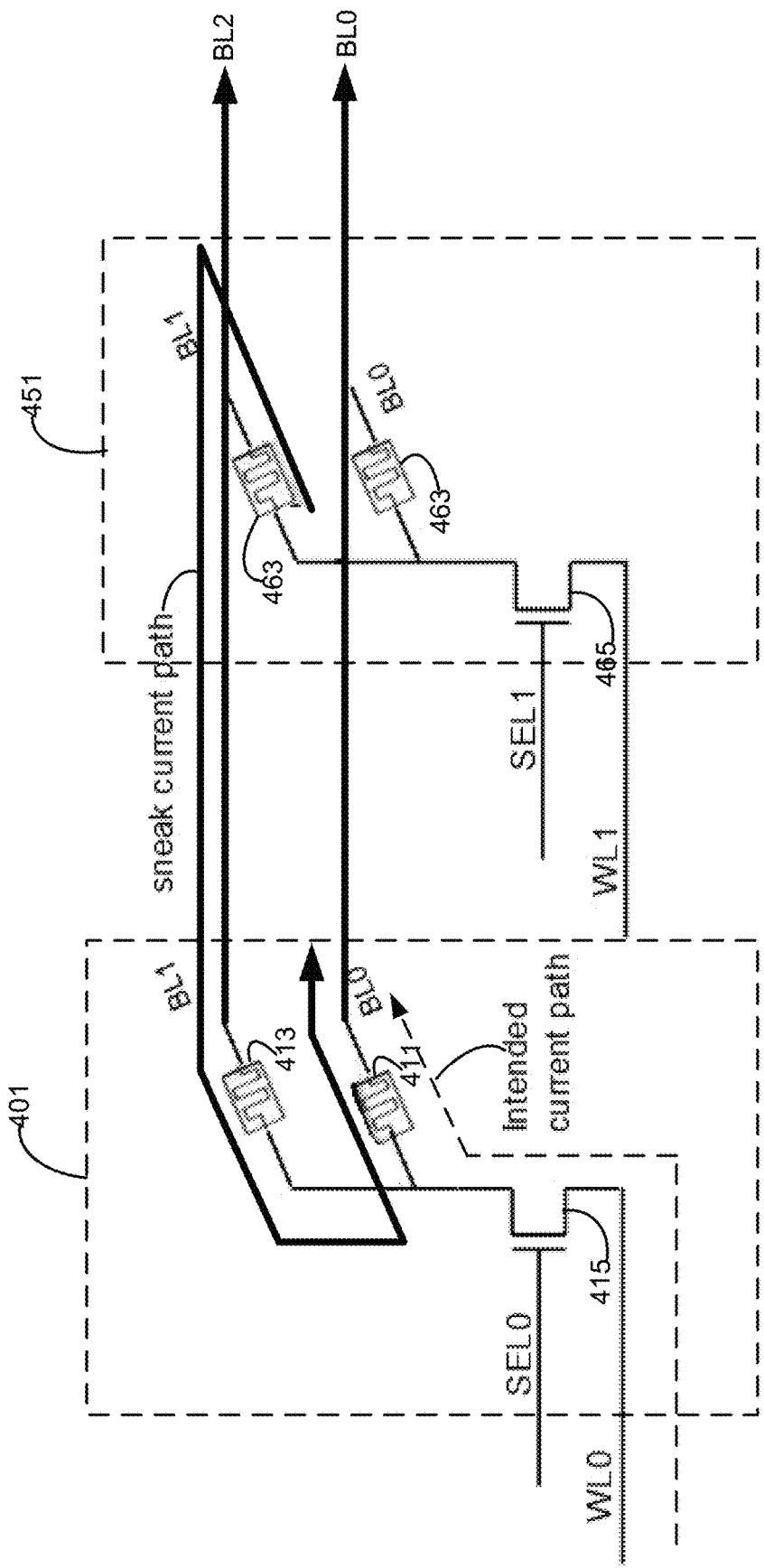
FIG. 4 is a block diagram illustrating an example 1T2R RRAM cell and potential sneak current paths within the 1T2R RRAM cell.

FIG. 4 is a block diagram 4000 illustrating an example 1T2R RRAM cell and potential sneak current paths within the 1T2R RRAM cell.

As shown in FIG. 4, there are two 1T2R RRAM devices: a first 1T2R RRAM device 401 and a second 1T2R RRAM cell device. The first 1T2R RRAM device 401 includes a first RRAM cell 411 and a second RRAM cell 413; the second 1T2R RRAM device 451 includes a third RRAM cell 461 and a fourth RRAM cell 463.

When a current is provided to the first RRAM cell 401, the intended current path includes a path from the first RRAM cell 411 to the bit line BL0. The intended current path does not include flowing the current through the second RRAM cell 413 to the bit line BL1.

A sneak current path, however, may exist from the second RRAM cell 413 to the bit line BL1. This sneak current path affects data retrieved responsive to the intended programming of the first RRAM cell 411 by causing write or read errors. As seen, using a single transistor to control two RRAM cells as does a 1T2R design, while providing higher density, has drawbacks, such as the existence of sneak current paths.

The disclosed technologies provide both a higher degree of control (as provided by a 1T1R design) and a higher density (as provided by a 1T2R design).

Figures 5A, 5B:
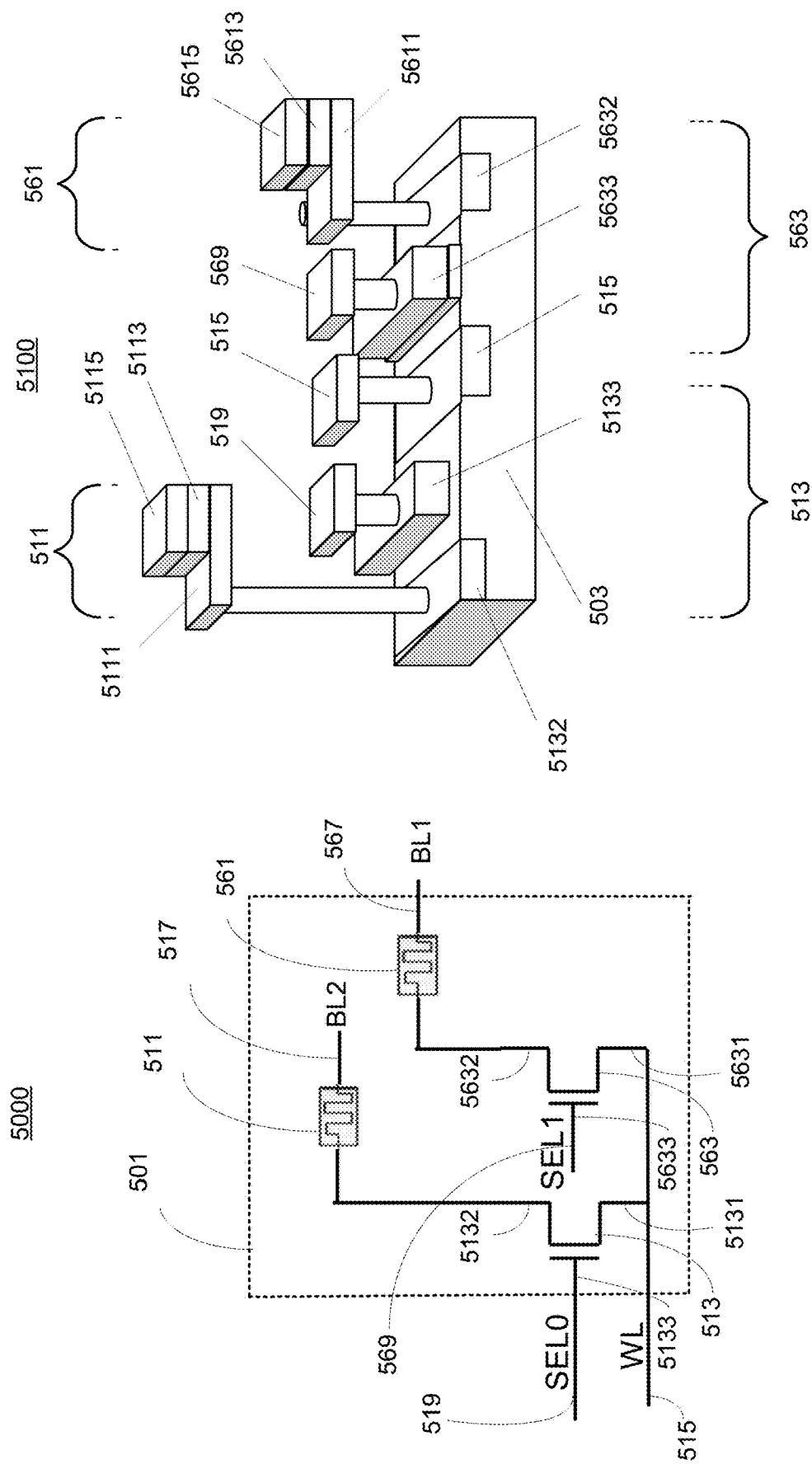
FIG. 5A is a block diagram illustrating an example nTnR RRAM cell in accordance with some implementations of the present disclosure.
FIG. 5B is a block diagram illustrating an example 2T2R RRAM cell in accordance with some implementations of the present disclosure.

FIG. 5A is a block diagram 5000 illustrating an example nTnR RRAM device 501 in accordance with some implementations of the present disclosure. An nTnR RRAM device 501 may be a 2T2R RRAM device, 3T3R RRAM device, 4T4R RRAM device, 5T5R RRAM device, and so on.

As shown in FIG. 5A, the nTnR RRAM device 501 is a 2T2R RRAM device, which includes: a first transistor 513, a first RRAM cell 511 connected to a first source terminal 5132 of the first transistor 513, a second transistor 563, a second RRAM cell 561 connected to a second source terminal 5632 of the second transistor 563, a word line 515 connected to a first drain terminal 5131 of the first transistor 513 and a second drain terminal 5631 of the second transistor 563, a first bit line 517 connected to the first RRAM cell 511; and a second bit line 567 connected to the second RRAM cell 561.

A first gate terminal 5133 of the first transistor 513 is connected to a first selective voltage source 519, and a second gate terminal 5633 is connected to a second selective voltage source 569. The selective voltage source may select an intended RRAM device for programming In some implementations, the drain terminal and the source terminal may be interchangeable.

FIG. 5B is a block diagram 5100 illustrating an example 2T2R RRAM device 501 in accordance with some implementations of the present disclosure.

As shown in FIG. 5B, the first transistor 513, the first RRAM cell 511, the second transistor 563, and the second RRAM cell 561 are formed on a same substrate 503. The first transistor 513 and the second transistor 563 have a shared or common source region 515.

The first RRAM cell 511 may include a first bottom electrode 5111, a first RRAM oxide 5113 formed on the first bottom electrode 5111, and a first top electrode 5115 formed on the first RRAM oxide 5113. The second RRAM cell 561 may include a second bottom electrode 5611, a second RRAM oxide 5613 formed on the second bottom electrode 5611, and a second top electrode 5615 formed on the second RRAM oxide 5613.

In some implementations, the source region 515, the first drain region 5132, and the second drain region is n-doped or p-doped. In some implementations, the substrate 503 is made from one or more of the following materials: Si, SiO$_2$, Indium Gallium Zinc Oxide (IGZO), Indium Tin Oxide (ITO), and glass.

In some implementations, the first top electrode 5115, the first bottom electrode 5111, a second top electrode 5615, and the second bottom electrode 5611 are made from one of more of the following materials: Pd, Pt, Ir, W, Ta, Hf, Nb, V, Ti, TiN, TaN, NbN, a combination thereof, or an alloy of Pd, Pt, Ir, W, Ta, Hf, Nb, V, Ti, TiN, TaN, NbN, with any other conductive material.

In some implementations, the first RRAM oxide 5113 and the second RRAM oxide 5613 made from one of more of the following materials: TaO$_x$ (where x≤2.5), HfO$_x$ (where x≤2), TiO$_x$ (where x≤2), or a combination thereof.

In some implementations, the SEL lines (e.g., SEL0 and SEL1) are parallel to the WL line. In other implementations, the SEL lines are parallel to the BL line. Whether SEL lines are parallel to the WL line or to the BL line may depend on a number of such factors as leakage, disturb, and peripheral circuit implementations.

By sharing a same source region, the total area size for including two transistors is reduced. Further, by having each RRAM device separately or independently controlled by a dedicated transistor, sneak current path is reduced or eliminated and the controllability of each RRAM cell within a circuit is increased.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A crossbar array circuit comprising:
   a first transistor comprising a first source terminal, a first drain terminal, and a first gate terminal;
   a first Resistive Random-Access Memory (RRAM) device connected to the first source terminal of the first transistor;
   a second transistor comprising a second source terminal, a second drain terminal, and a second gate terminal;
   a second RRAM device connected to the second source terminal of the second transistor;
   a word line connected to the first drain terminal of the first transistor and the second drain terminal of the second transistor;
   a first bit line connected to the first RRAM device; and
   a second bit line connected to the second RRAM device, wherein the first gate terminal of the first transistor is configured to be connected to a first selective voltage source, and the second gate terminal is configured to be connected to a second selective voltage source.

2. The crossbar array circuit as claimed in claim 1, wherein the first transistor, and the second transistor are formed on a same substrate.

3. The crossbar array circuit as claimed in claim 2, a material of the substrate comprises Si, SiO$_2$, indium gallium zinc oxide (IGZO), indium tin oxide (ITO), or glass.

4. The crossbar array circuit as claimed in claim 2, wherein the first source terminal and the second source terminal are a same source region on the substrate.

5. The crossbar array circuit as claimed in claim 4, wherein the first drain terminal is a first drain region on the substrate, the second drain terminal is a second drain region on the substrate; and wherein the source region, the first drain region, or the second drain region is n-doped or p-doped.

6. The crossbar array circuit as claimed in claim 1, wherein the first RRAM device comprises a first bottom electrode, a first RRAM oxide formed on the first bottom electrode, and a first top electrode formed on the first RRAM oxide; and wherein the second RRAM device comprises a second bottom electrode, a second RRAM oxide formed on the second bottom electrode, and a second top electrode formed on the second RRAM oxide.

7. The crossbar array circuit as claimed in claim 6, wherein a material of the first top electrode, the first bottom electrode, a second top electrode, or the second bottom electrode comprises Pd, Pt, Ir, W, Ta, Hf, Nb, V, Ti, TiN, TaN, NbN, or a combination of alloy or other conductive materials thereof.

8. The crossbar array circuit as claimed in claim 6, a material of the first RRAM oxide, or the second RRAM oxide comprises TaOx (where $x \leq 2.5$), $HfO_x$ (where $x \leq 2$), TiOx (where $x \leq 2$), or a combination thereof.

* * * * *